United States Patent
Satoh et al.

(10) Patent No.: US 6,720,690 B2
(45) Date of Patent: Apr. 13, 2004

(54) VIBRATION MOTOR HOLDING APPARATUS AND PORTABLE ELECTRONIC EQUIPMENT HAVING THE SAME

(75) Inventors: Noriyoshi Satoh, Kanagawa (JP); Koutarou Hirai, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/826,632

(22) Filed: Apr. 5, 2001

(65) Prior Publication Data

US 2001/0035687 A1 Nov. 1, 2001

Related U.S. Application Data

(62) Division of application No. 09/472,477, filed on Dec. 27, 1999, now Pat. No. 6,274,955.

(30) Foreign Application Priority Data

Dec. 28, 1998 (JP) .......................................... 10-373786

(51) Int. Cl.[7] ................................................ H02K 7/06
(52) U.S. Cl. .......................... 310/81; 310/89; 361/752; 361/816
(58) Field of Search ..................... 310/811, 85, 88, 310/89, DIG. 6, 40 MM; 361/748, 752, 753, 807, 816, 818

(56) References Cited

U.S. PATENT DOCUMENTS

| | | | | |
|---|---|---|---|---|
| 4,853,568 A | * | 8/1989 | Fujiwara | 174/51 |
| 5,107,155 A | * | 4/1992 | Yamaguchi | 310/81 |
| 5,132,864 A | | 7/1992 | Takemura et al. | 361/409 |
| 5,170,009 A | * | 12/1992 | Kadokura | 174/35 MS |
| 5,341,057 A | * | 8/1994 | Yamaguchi et al. | 310/81 |
| 5,780,947 A | * | 7/1998 | Fukuoka et al. | 310/80 |
| 5,793,133 A | * | 8/1998 | Shiraki et al. | 310/179 |
| 5,801,466 A | * | 9/1998 | Odagiri et al. | 310/81 |
| 5,835,006 A | * | 11/1998 | Michalak et al. | 340/407.1 |
| 5,836,496 A | * | 11/1998 | Levin et al. | 224/553 |
| 5,897,040 A | * | 4/1999 | Ward | 224/413 |
| 5,986,367 A | * | 11/1999 | Tsuzaki et al. | 310/71 |
| 6,274,955 B1 | * | 8/2001 | Satoh et al. | 310/71 |
| 6,365,995 B1 | * | 4/2002 | Fukuda et al. | 310/156.38 |
| 6,384,498 B1 | * | 5/2002 | Yamaguchi et al. | 310/154.07 |
| 6,394,768 B1 | * | 5/2002 | Fukuda et al. | 310/71 |

FOREIGN PATENT DOCUMENTS

| | | |
|---|---|---|
| GB | 2 316 733 A | 3/1998 |
| JP | 09214079 | 8/1997 |

OTHER PUBLICATIONS

Patent Abstract of Japan Publication No. 10248203, Publication Date: Sep. 14, 1998, "Cored Brushless Virbrating Motor", 1 page.
Patent Abstract of Japan Publication No. 2000166173, Publication Date: Jun. 16, 2000, "Flat Vibration Motor, and Portable Information Apparatus Equipped Therewith", 1 page.
Patent Abstract of Japan Publication No. 2000031611, Publication Date: Jan. 28, 2000, "Structure of Circuit Board for Electronic Device", 1 page.

* cited by examiner

*Primary Examiner*—Dang Le
(74) *Attorney, Agent, or Firm*—Pearne & Gordon LLP

(57) ABSTRACT

A vibration motor 18 constituted by a motor provided with a weight 57 is covered with a cover 44 having a flat portion for making the cover 44 be sucked easily and a marking for positioning, and this vibration motor is mounted on a main-body printed board 9. In this main-body printed board, line lands and main-body lands also having a function for identification are provided outside the outline of the mounted vibration motor, so that a displacement of the mounting position can be easily detected even visually.

20 Claims, 6 Drawing Sheets

VIBRATION MOTOR HOLDING APPARATUS AND PORTABLE ELECTRONIC EQUIPMENT HAVING THE SAME

This patent application is a divisional patent application of U.S. patent application Ser. No. 09/472,477 filed on Dec. 27, 1999, which issued as U.S. Pat. No. 6,274,955 on Aug. 14, 2001.

BACKGROUND OF THE INVENTION

1. Technical Field of the Invention

The present invention relates to a vibration motor which is used in a portable electronic equipment such as a portable telephone, a pocket bell or the like, and which silently informs a user of incoming etc. by vibration, and relates to a portable electronic equipment having the vibration motor.

2. Description of the Related Art

JP-A-10-248203 discloses one of conventional vibration motors used as silent information sources in miniature radio communication equipment, in which a cored-type brushless vibration motor is disclosed.

FIG. 6 is a sectional view of a main portion of the cored-type brushless vibration motor.

In FIG. 6, a bearing holder portion 102 is provided at the center of a bracket 101 forming the bottom of the vibration motor. This bearing holder portion 102 has a catch portion 103 and an erected portion 104 formed by cutting and erecting a part of the bracket 101.

A sintered oilless bearing 105 is attached to the inside of this bearing holder portion 102 through a cover plate 106, and a stator core 109 having an armature coil 108 wound on a plurality of salient poles 107 is attached to the outside.

A rotor 110 has a magnet holder 111 and a cylindrical magnet 113 fixed to the magnet holder 111 and having a plurality of field poles disposed in a blade portion 112 of the stator core 109 through a radial gap. Further, the rotating body 110 is fitted by pressing a shaft 115 into a burringhole 114 disposed at the rotation center of the magnet 113. In addition, one end of the shaft 115 is rotatably supported by the sintered oilless bearing 105, and the other end is rotatably supported through a similar sintered oilless bearing by a case 116 having another function as a cover.

In addition, a power supply method is to connect a terminal of the coil to one side of a flexible printed board so as to drive the motor.

However, in the above-mentioned conventional art, a usual vibration motor is extracted by an automatic sucking machine, automatically arranged on a board and subjected to assembling in a normal automatic assembling/wiring process in the case where the vibration motor is supplied by a parts maker in the packaged form of a pallet, a reel or the like. In that case, first, the vibration motor cannot be extracted by the automatic sucking machine if the vibration motor has a shape similar to that as mentioned above. That is, the automatic sucking machine sucks the ceiling of a part pneumatically. However, the aforementioned vibration motor is not even in the ceiling of the vibration motor because a sintered oilless bearing for rotatably supporting a shaft lies at the center of a cover. Therefore, even if the ceiling is sucked pneumatically by the automatic sucking machine, the air leaks from a gap between the shaft and the bearing so that sucking of the ceiling cannot be performed Further, since the vibration motor in the conventional art is not designed to suit a reflow soldering, special parts are required for assembling the vibration motor into a miniature radio communication equipment and holding the vibration motor therein, and the work for making the above operation demands expert employees, so that the number of labor-hour and the cost are increased. It is therefore necessary to make the vibration motor at least suitable for the reflow soldering so that the vibration motor can be applied to an automatic assembling process for mass production.

In the reflow soldering method, after parts to be mounted are arranged on a printed board, the parts and the board are passed through a ref low furnace so as to be connected with each other by solder. This solder is obtained in a way such that creamy solder is passed through an atmosphere at a high temperature to be fused and then the fused solder is solidified after being cooled. Here, it is necessary to pay attention to the case where solder balls scattering in the reflow furnace adhere to a coil or a magnet in the middle of the reflow soldering. In that case, it is necessary to give enough consideration to such a trouble that such an adhering solder ball blocks starting when the vibration motor starts, or such a solder ball rubs on the coil, the magnet or the like so as to generate irregular noise, etc.

In addition, even if the vibration motor is mounted on the printed board, it is necessary to perform accurate or proper positioning of the vibration motor. It is therefore necessary to take a dimensional measurement of the mounted position of the vibration motor. There are a large number of problems like the above matters when the reflow soldering is performed.

That is, in order to perform the reflow soldering perfectly so as to automate a wiring/assembling process, there has been a problem that automation must be fulfilled in all the steps of the following items 1 to 4 while the quality have to be also guaranteed.

1. To extract supplied parts by means of an automatic sucking machine or the like.
2. To arrange the extracted parts onto a printed board automatically.
3. To take measures against solder balls in a reflow furnace.
4. To inspect the positions of the parts after the parts are mounted.

SUMMARY OF THE INVENTION

An object of the present invention is to provide a vibration motor holding apparatus in which a configuration of a vibration generating means is realized with guaranteed quality by all the steps of extracting supplied parts, automatically arranging the parts onto a printed board, taking measures against solder balls in a reflow furnace, and identifying/inspecting the positions of the parts after the parts are mounted, in order to perform reflow soldering upon the vibration generating means together with other electronic parts on the same printed board in a lump without using any special parts such as elastic or inelastic holding members or the like.

In order to achieve the above object, according to a first aspect of the present invention, there is provided a vibration motor holding apparatus comprising: a rotating body having a rotary member provided on an external surface of a base, and a cover for covering the rotary member; and a board on which the rotating body is mounted; wherein a position identifying mark is provided on the board in order to mount the rotating body in a predetermined position on the board, the position identifying mark being exposed or bared in the outside of an outline of the rotating body when the rotating body is mounted in the predetermined position on the board.

With this configuration, in the case where a motor such as a cored-type brushless motor, a coreless brushless motor, a brush-type motor, or the like, is used as a vibration motor to function as a rotating body, when the rotating body of any type of such motors is mounted on a printed board, automatic arrangement of the rotating body on the printed board can be made easily by automatically sucking the ceiling of the cover of the rotating body. It can be confirmed from above that the identification mark provided outside the rotating body attachment position on the board is hidden by the rotating body if the position of the rotating body mounted on the board is abnormal, while the mark is exposed or bared in the outside of the rotating body when the position is normal. It is therefore possible to easily identify, judge and inspect whether terminals on the base on the rotating body side are surely connected to corresponding main-body lands on the board or not, whether the terminals are short-circuited with other lands or not, whether the rotating body does not abut against other parts or not, and so on.

According to a second aspect of the present invention, there is provided a vibration motor holding apparatus comprising: a vibration motor having a base in which terminals are formed on a back surface or a side surface of the base, a stator in which a coil is wound around a stator core, a magnet disposed in opposition to the stator, and a cover provided to cover the stator and the magnet, the stator and the magnet being disposed on a front surface side of the base so that one of the stator and the magnet is not rotatable relatively to the base while the other is rotatable; and a board on which the vibration motor is mounted; wherein a position identifying mark exposed or bared in the outside of an outline of the vibration motor mounted in a predetermined position on the board is provided on the board.

With this configuration, the vibration motor is constituted by a brushless motor constituted by a stator in which a coil is wound on a stator core, and a rotor magnet. When the vibration motor is mounted on a printed board, the cover ceiling of the vibration motor is sucked automatically so that it becomes easy to arrange the vibration motor on the board automatically. It can be confirmed from above that the identification mark provided outside the vibration motor attachment position on the board is hidden by the vibration motor if the position of the vibration motor mounted on the board is abnormal, while the mark is exposed or bared in the outside of the vibration motor if the position is normal. It is therefore possible to easily identify, judge and inspect whether terminals on the base on the vibration motor side are surely connected to corresponding main-body lands on the board or not, whether the terminals are short-circuited with other lands or not, and so on.

According to a third aspect of the present invention, there is provided a vibration motor holding apparatus comprising: a rotating body having a base, a rotary member provided on a front surface side of the base, and a cover having an electromagnetically shielding property and provided to cover the rotary member; a board on which the rotating body is mounted; and a shield member provided to cover at least a part of the board; wherein the rotating body is disposed inside the shield member With this configuration, noise generated from the rotating body which may be constituted by various motors can be prevented from leaking outside the rotating body. In addition, it may not be necessary to provide a shield member for electromagnetically shielding the rotating body from other parts mounted on the board. It is therefore possible to ensure a mounting area on the printed board as large as possible, so that it is possible to improve the mounting efficiency.

According to a fourth aspect of the present invention, there is provided a vibration motor holding apparatus comprising: a vibration motor having a base in which terminals are formed on a back surface or a side surface of the base, a stator in which a coil is wound around a stator core, a magnet disposed in opposition to the stator, and a cover provided to cover the stator and the magnet, the stator and the magnet being disposed on a front surface side of the base so that one of the stator and the magnet is not rotatable relatively to the base while the other is rotatable; a board on which the vibration motor is mounted; and a shield member provided to cover parts mounted on the board; wherein the vibration motor is disposed inside the shield member.

With this configuration, noise generated from the vibration motor constituted by a brushless motor is prevented from leaking outside the vibration motor. In addition, it may not be necessary to provide a shield member for electromagnetically shielding the vibration motor from other parts mounted on the board. It is therefore possible to ensure a mounting area on the printed board as large as possible, so that it is possible to improve the mounting efficiency.

According to a fifth aspect of the present invention, in the above vibration motor holding apparatus, an air hole is provided in the cover so as to connect spaces inside and outside the cover to each other.

When electronic parts, a motor, and so on constituting a receiving circuit portion or a radio circuit portion pass through a reflow furnace together with the main-body printed board, these electronic parts, motor, etc. pass through an atmosphere at 150° C. to 250° C. for a predetermined period. At this time, if the inside of the cover had a closed structure as in the background art, force was generated against the internal surface of the cover due to thermal expansion of air in the inside of the cover so that the cover was separated from the motor printed board. However, with the above-mentioned configuration, very small air holes connecting the outside and the inside of the cover are provided so that the air inside the cover can be prevented from expanding. It is therefore possible to avoid an unexpected situation such as the separation of the cover or the like.

According to a sixth aspect of the present invention, in the above vibration motor holding apparatus, a portion of the cover is made to contact against the surface of the base so as to perform positioning of the cover in the height direction.

With this configuration, the distance between the ceiling of the cover and the back surface of the base, that is, the height of parts can be formed with precision if the parts are formed so that the distances between the abutment surfaces of the parts against the base and the ceilings of the parts do not scatter, and if the thickness of the base is controlled. It is possible to easily distinguish the case where the vibration motor is mounted abnormally with foreign matters etc. interposed between the base and the board, from the case where the vibration motor is mounted normally.

According to a seventh aspect of the present invention, in the above vibration motor holding apparatus, at least one of the mark, marking on the top surface of the cover, shapes of the base and the cover, and a fillet formed outside the base is used for positioning the vibration motor.

With this configuration, it is possible to accurately detect a displacement in the vibration motor mounting position in a two-dimensional direction (the planar direction of the board).

According to an eighth aspect of the present invention, in the above vibration motor holding apparatus, the cover is electrically connected to the board.

With this configuration, it is possible to ground the cover.

According to a ninth aspect of the present invention, in the above vibration motor holding apparatus, the mark is a grounding pattern.

With this configuration, if the mark for position identification is a grounding pattern, it may not be necessary to screen-print solder on the mark. It is therefore possible to make the mark function as an identification mark because the state of the surface of the mark does not change even after mounting.

According to a tenth aspect of the present invention, there is provided a portable electronic equipment provided with a vibration motor holding apparatus according to any one of the first to ninth aspects of the present invention.

With this configuration, in a portable electronic equipment, the vibration motor can be attached into a reduced space as a silent information means for informing a user of incoming or the like silently by vibration.

DETAILED DESCRIPTION OF THE PRESENT INVENTION

The present invention will be described in detail with reference to the accompanying drawings.

Figure 1:
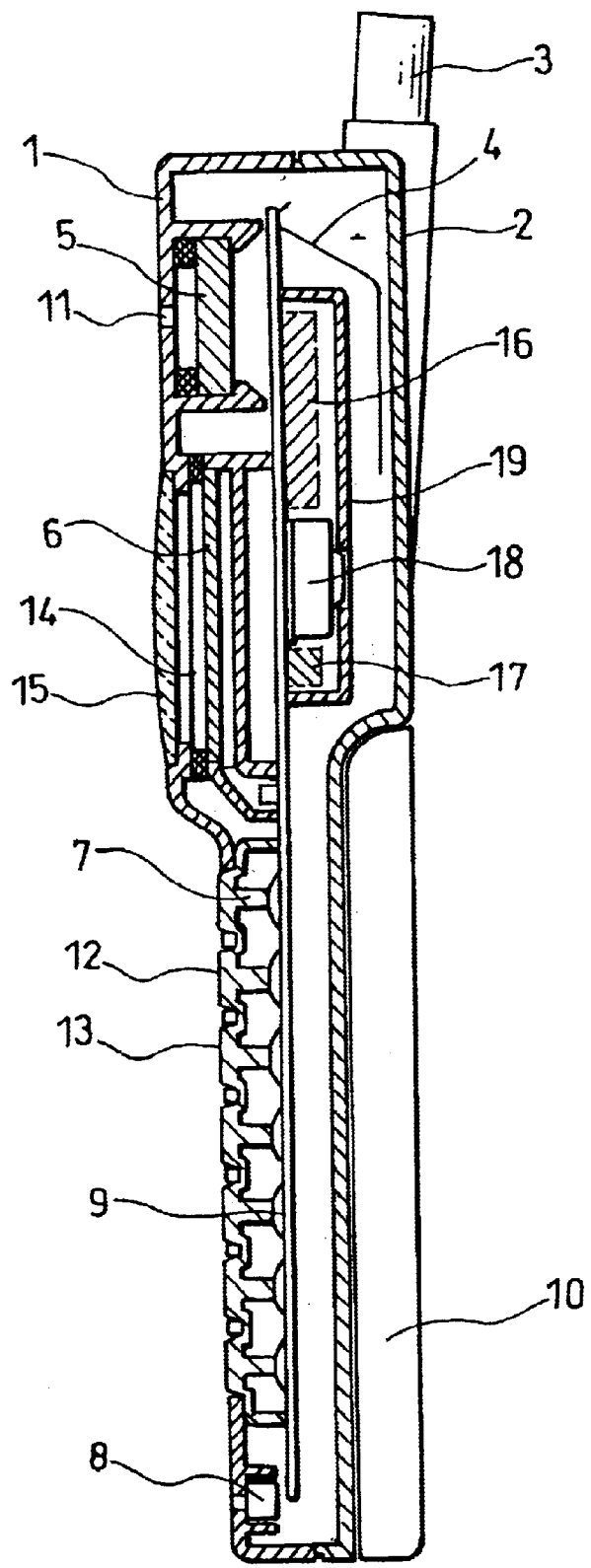
FIG. 1 shows a sectional view of a portable electronic equipment having a vibration motor holding apparatus according to an embodiment of the present invention.

FIG. 1 is a sectional view of a portable electronic equipment having a vibration motor holding apparatus according to an embodiment of the present invention.

Figure 2A:
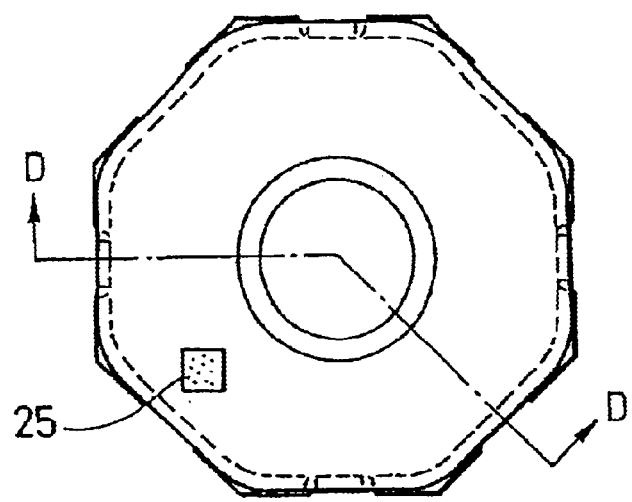
FIG. 2 shows configuration views of a motor shown in FIG. 1.
Figure 2B:
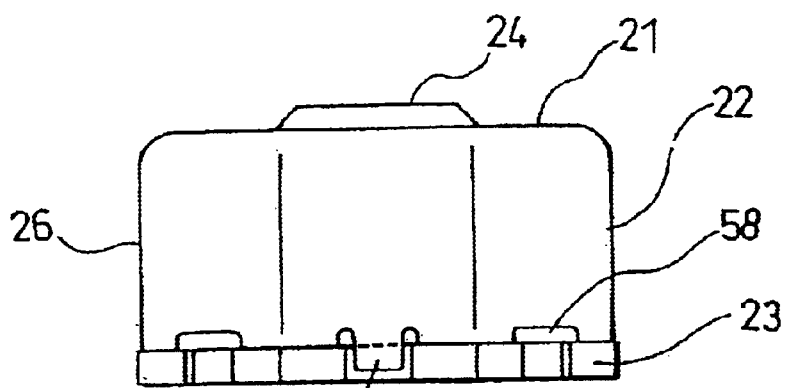
Figure 2C:
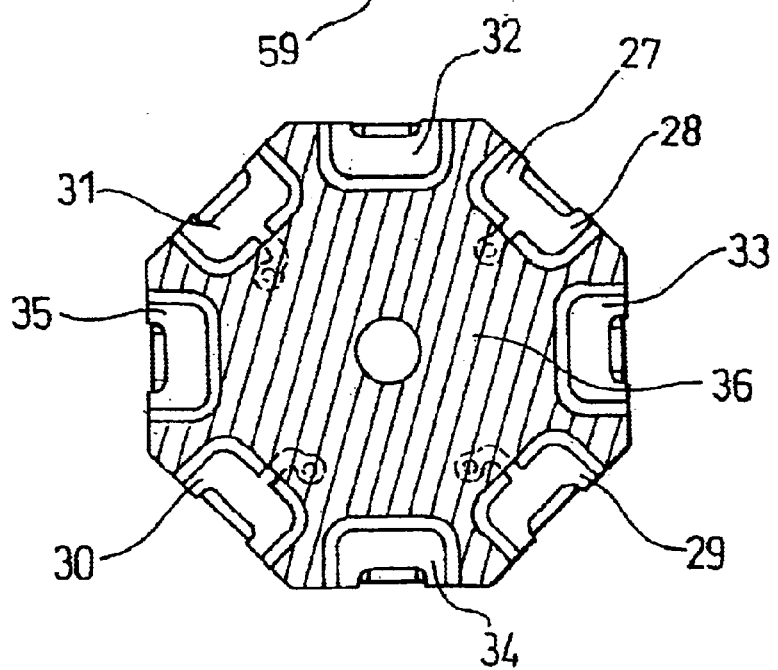

FIGS. 2A to 2C are views each showing a configuration of a motor shown in FIG. 1.

Figure 3:
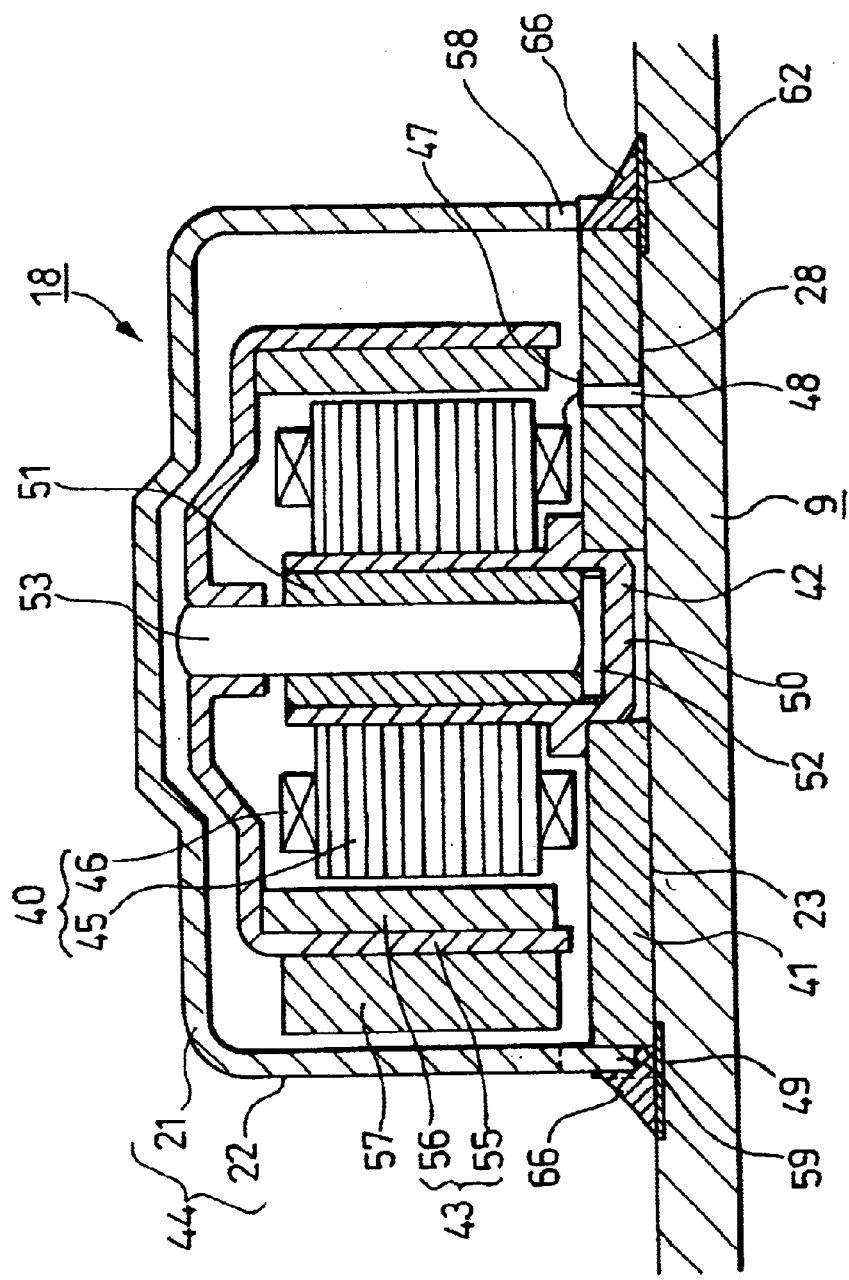
FIG. 3 shows a sectional view when the motor shown in FIG. 2A has been mounted on a main-body printed board.

FIG. 3 is a sectional view when the motor shown in FIGS. 2A to 2C is mounted on a main-body printed board.

Figure 4:
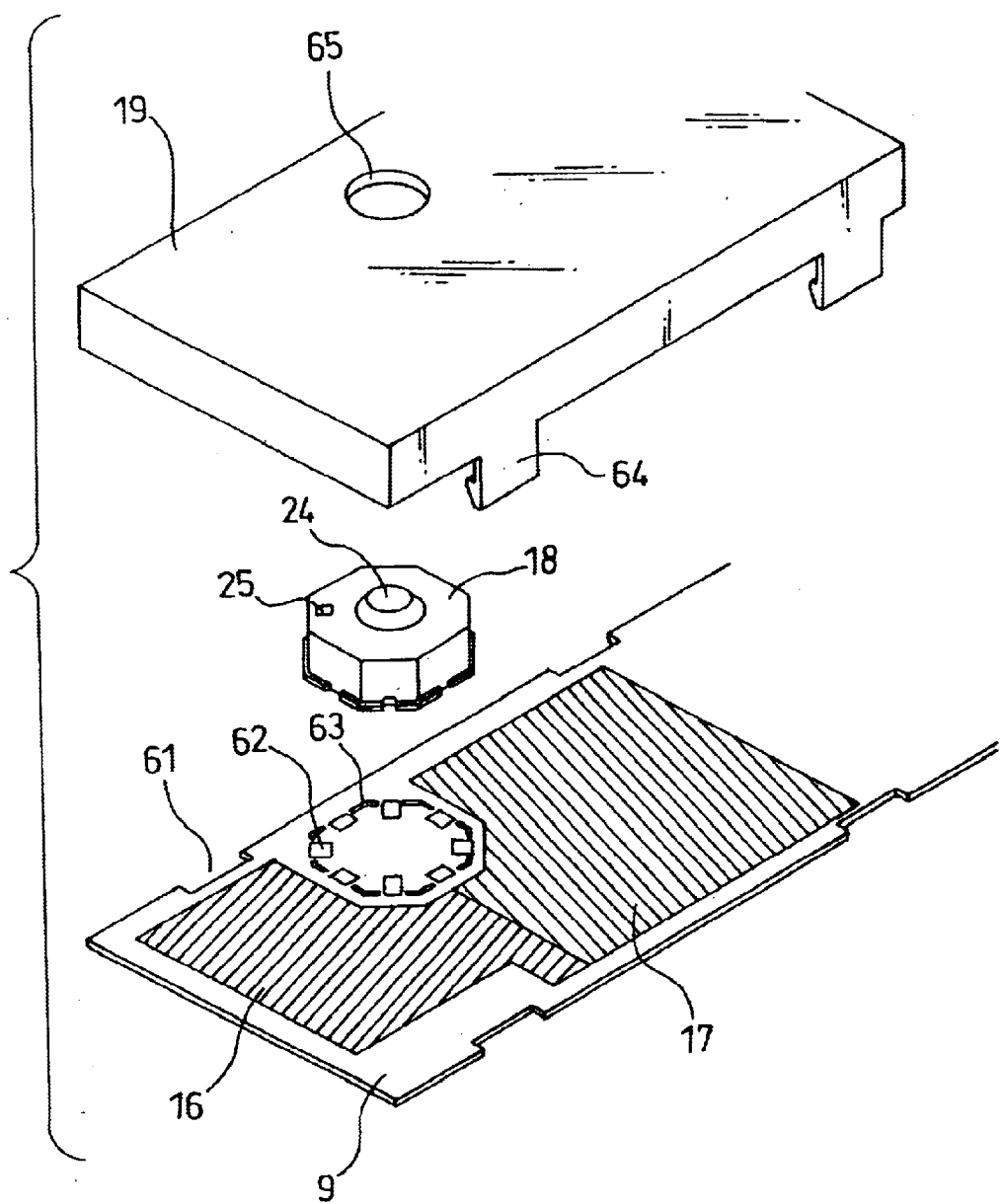
FIG. 4 shows an exploded perspective view of the main-body printed board, the motor and a shield case shown in FIG. 3.

FIG. 4 is an exploded perspective view of the main-body printed board, the motor and a shield case shown in FIG. 3.

Figure 5:
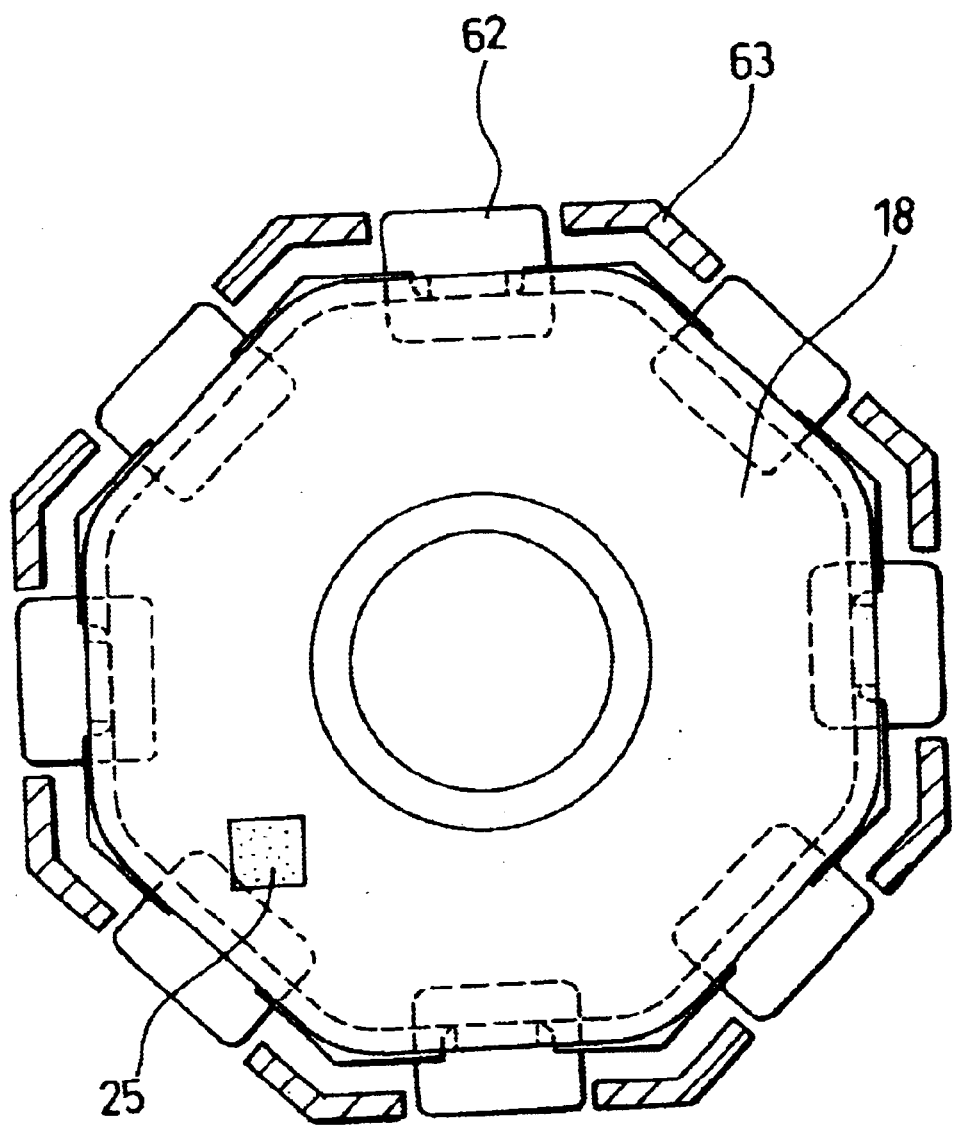
FIG. 5 shows a view showing a state in which the motor has been mounted on the main-body printed board shown in FIG. 4.
Figure 6:
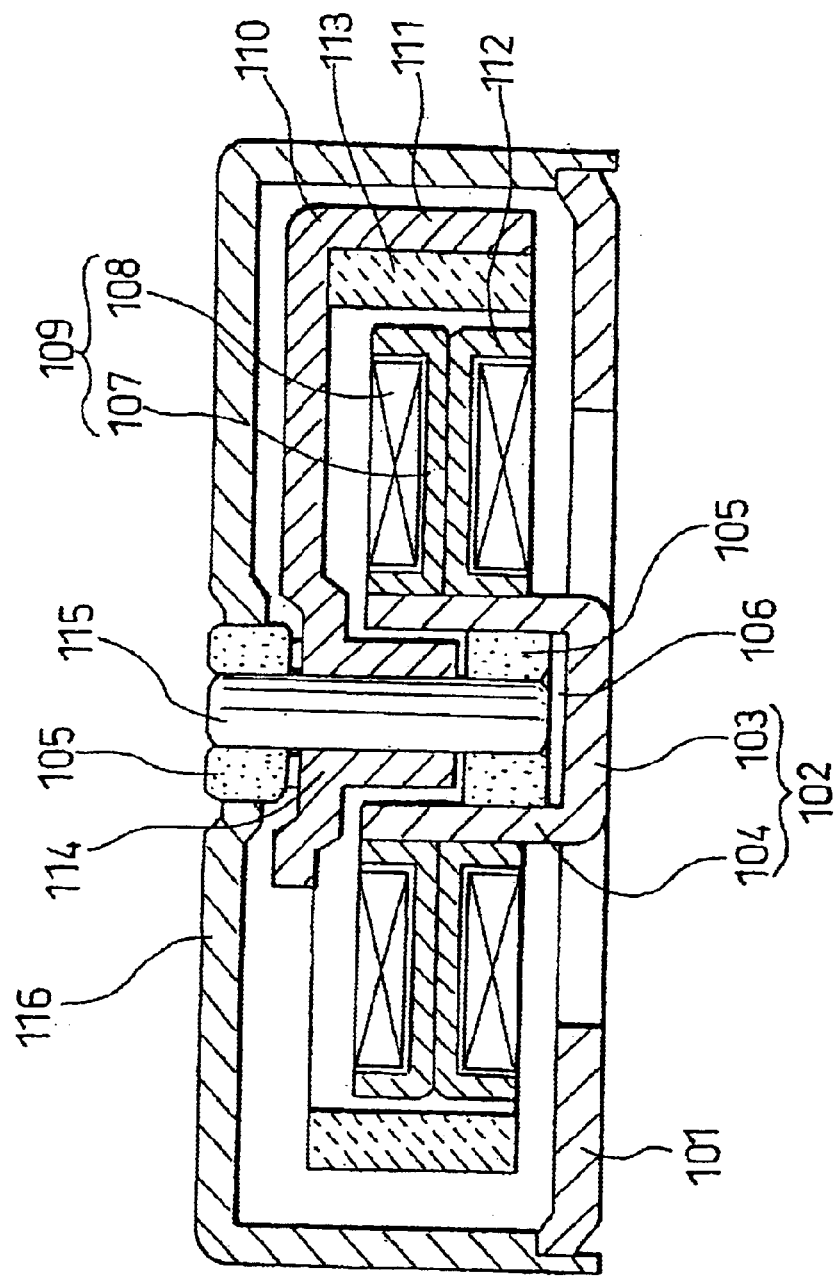
FIG. 6 shows a sectional view of a main portion of a background-art cored-type brushless vibration motor.

FIG. 5 is a view showing a state in which the motor is mounted on the main-body printed board shown in FIG. 4.

In FIG. 1, a transmitting/receiving antenna 3, a receiving antenna 4, a receiver 5 for outputting voice, a liquid-crystal display 6 for displaying characters, symbols and so on, a key sheet 7 on which characters/symbols are printed, a transmitter 8, a main-body printed board 9 and so on are disposed in a case formed by an upper case 1 and a lower case 2. A battery 10 for supplying electric power is attached to the outside of the case.

The upper case 1 has a sound hole 11 for guiding voice generated from the receiver 5 to the outside of the case, a plurality of key holes 13, the number of which are as many as those of protrusions 12 of the key sheet 7 inserted to the key holes 13 correspondingly, an aperture 14 having a size equivalent to that of the liquid-crystal display 6, and so on. This aperture 14 is closed by a transparent window 15 such that a user can recognize characters, symbols and so on displayed on the liquid-crystal display 6.

An oscillator for controlling an oscillating frequency by voltage (thereinafter, referred to as VCO), a plurality of resistors, capacitors, and so on, are mounted on the back surface of the main-body printed board 9 so as to form a receiving circuit portion 16 constituted by a low-noise amplifier, a first mixer and so on. On the surface side of the main-body printed board 9, a temperature-compensated quartz oscillator (thereinafter referred to as TCXO) for stably controlling a frequency, a plurality of resistors, capacitors and so on are mounted so as to form a radio circuit portion 17. These receiving circuit portion 16 and radio circuit portion 17 together with a motor 18 as a vibration motor and a motor driving circuit (not shown) which are mounted adjacently thereto are received in and covered with a shield case 19 of resin for preventing invasion of electromagnetic waves from the outside.

The shield case 19 is made of resin material such as acrylonitrile, butadiene, styrene or the like. Non-electrolytic copper plating is given to the surface of the shield case 19 so that electromagnetic waves are prevented from passing through the shield case 19. Non-electrolytic nickel plating is further given to the surface of the non-electrolytic copper plating so that the non-electrolytic copper plating is subjected to anti-corrosive treatment.

Next, the motor 18 will be described in detail with reference to FIGS. 2A to 2C. FIG. 2A is a plan view of the motor, FIG. 2B is a front view, and FIG. 2C is a back view.

As shown in FIGS. 2A to 2C, the outline of the motor 18 has a flat shape having a top portion 21, a side portion 22 and a bottom portion 23. The shape viewed from above is substantially octagonal. A flat portion 24 which can face a suction chuck of an automatic sucking machine is formed on the top portion 21.

In addition, the top portion 21 or the side portion 22 is provided with a marking 25 for making the attachment direction distinguishable. The marking 25 is formed by black stamping (printing) so that the marking 25 has a difference in optical reflectivity from the surrounding, or the surface of the marking 25 is roughened by laser exposure irradiation so that the surface has a tone difference from other portions.

The side portion 22 is surrounded by eight wall surfaces 26 over the whole circumference of the side portion 22. The bottom portion 23 has eight back-surface terminals 27 so that signal terminals 28 to 31 and earth terminals 32 to 35 are formed alternately at substantial centers of respective sides. The rest portion of the bottom portion 23 is an insulator 36.

Next, FIG. 3 is a sectional view showing a section taken on line D—D of FIG. 2A when the motor is mounted on the main-body printed board.

In FIG. 3, the motor 18 has a stator 40, a motor printed board (base) 41, a bearing unit 42, a rotor 43 and a cover 44. The cover 44 chiefly forms the top portion 21 and the side portion 22, and the motor printed board 41 forms the bottom portion 23. The stator 40 is formed by covering the surface of a stator core 45 with insulating film and then winding a coil 46 thereon. A double-sided through-hole board is used as the motor printed board 41. This motor printed board 41 has a bottom surface, a stator attachment surface which is a back surface of the bottom surface, and an outer-circumferential end surface.

A plurality of surface terminals 47 (four in total) on the stator attachment opposite sides of the motor printed board 41 are electrically connected to corresponding back-surface terminals (only 28 is illustrated in FIG. 3) on the bottom surface side through through-holes 48.

In addition, metal surfaces 49 capable of soldering are formed at eight places of the outer-circumferential end surface so that the earth terminals 32 to 35 (see FIG. 2C) are electrically connected to the signal terminals 28 to 31. These metal surfaces 49 are formed at the same time as the through-holes 48. Further, the bearing unit 42 and the stator 40 are fixed coaxially to the stator attachment surface of the motor printed board 41. Four terminals of the coil 46 wound on the stator core 45 are soldered with the respective surface terminals 47.

The bearing unit 42 is constituted by a closed-end housing 50, an oilless metal 51, a thrust pad 52, and a shaft 53 inserted into the thrust pad 52 so that one end of the shaft 53 is fixedly attached to the center of the rotor 43 by a method of caulking, pressing-in, welding or the like. The oilless metal 51 is made such that powder of iron, copper or the like is formed into a porous body by a powdered metal technique and pores of the porous body are impregnated with lubricating oil to some extent.

The rotor 43 has a rotor yoke 55 and an annular magnet 56 fixed to the rotor yoke 55. The above-mentioned shaft 53 is fixedly attached to the center of the rotor yoke 55. The rotor yoke 55 surrounds the stator 40, and the rotor yoke 55 is supported rotatably by the bearing unit 42. Further, the rotor 43 has a mass eccentricity. The mass eccentricity in this case is obtained by fixedly attaching an arc weight 57 to the outer circumference of the rotor yoke 55. In order to stabilize the dispersion of the amount of vibration often generated due to the mass eccentricity, a control motor is used for stabilizing and controlling the number of rotations.

In particular, the control motor is a three-phase brushless motor for detecting a magnetic position by counter electromotive force without using any hall device. In the equipment, centrifugal force F is generated by the rotation of the motor, and this force F is transmitted to the equipment so that the equipment vibrates. The centrifugal force F is expressed by the following expression (1).

$$F = mr\omega^r \tag{1}$$

where $\omega = 2\pi f$;

m: the weight weighs m, r: the barycentric radius f: the rotation frequency.

Therefore, in the case where it is intended to obtain the same centrifugal force, the barycentric radius r becomes large if the weight 57 is provided in the outermost circumference of the rotor 43. Accordingly, the weight 57 can be lightened so that the weight of the motor 18 can be reduced. As a result, this weight reduction of the motor 18 can also contribute to weight reduction in the equipment.

As has been described above, the cover 44 has an approximately cup-like shape having the top portion 21 and the side portion 22 The cover 44 covers the rotor 43, and the forward end of the side portion 22 abuts on the vicinity of the outer circumferential edge of the stator attachment surface of the motor printed board 41. However, part of the forward end does not abut thereon but forms air holes 58 (also shown in FIG. 2B) connecting the inside and outside of the cover. In addition, these air holes 58 are connected with the signal terminals 28 to 31 (see FIG. 2C) so as to have another function as spaces for preventing the signal terminals 28 to 31 from being short-circuited with the above-mentioned metal surfaces formed on the outer circumferential end surface of the motor printed board.

Further, protrusion portions 59 are formed in the edge portion of the side portion 22 The protrusion portions 59 (also shown in FIG. 2B) are soldered and fixed to the metal surfaces 49 connected to the opposite earth terminals of the motor printed board 41. Here, although the cover 44 is fixed by the above-mentioned solder, an iron plate is used as the base material of the cover 44 and subjected to tin plating for anti-corrosive treatment in order to obtain wettability for solder. Silver, gold, etc. may be used as alternative plating. Alternatively, nickel silver (German silver) may be used. In that case, plating is not required because solder adheres to nickel silver.

The motor 18 configured thus is mounted as a vibration motor directly on the main-body printed board 9 of the electronic equipment.

Next, the main-body printed board 9 will be described in detail.

FIG. 4 is an exploded perspective view of the main-body printed board, the motor and the shield case.

In FIG. 4, the main-body printed board 9 has a substantially rectangular shape. A plurality of notches 61 are formed in the outer circumference of the main-body printed board 9. Various electronic parts are mounted on the main-body printed board so as to form the receiving circuit portion 16 and the radio circuit portion 17. Further, a plurality of main-body lands 62 opposite to the back-surface terminals 27 of the motor board 41 are formed near the receiving circuit portion 16 and the radio circuit portion 17, and a plurality of line lands (marks for identification) 63 connected to the grounding pattern of the main-body printed board 9 are formed near these main-body lands. These main-body lands 62 and line lands have another function as identification marks which are located outside the mounted motor.

A plurality of hook claws 64 formed in the outer circumference of the shield case 19 engage with the notches 61 correspondingly, and the shield case 19 is attached to the main-body board 9 so as to cover the motor 18 as well as the receiving circuit portion 16 and the radio circuit portion 17. In this embodiment, a hole 65 is provided in the shield case 19 in order to avoid interference of the shield case 19 with the flat portion 24 of the motor 18 in the assembling process. Then, in order to prevent noise from leaking from this hole 65, the gap between the top portion 21 and the shield case 19 is set to be not more than 0.5 mm on the basis of the results of experiments carried out by the present inventors.

Next, description will be made about how to mount the motor 18 on the main-body printed board 9.

FIG. 5 is a plan view showing a state where the motor has been mounted on the main-body printed board 9.

In FIG. 5, the line lands 63 are disposed so as to surround the external form of the mounted motor 18 when the motor 18 is mounted in a predetermined position on the main-body printed board 9 (FIG. 4) and then the main-body lands 62, the back-surface terminals 27 (FIG. 2C) of the motor 18 and the metal surfaces 49 (FIG. 3) are connected respectively by solder. That is, when the motor 18 is mounted on the printed board 9, the motor 18 overlaps with some of the line lands 63 if the motor 18 is in a state (mounting displacement) that the motor 18 is somewhat displaced from the predetermined position or somewhat rotated clockwise or counterclockwise (mounting displacement). As a result, the phenomenon can be grasped and recognized visually easily.

In addition, if the above-mentioned mounting displacement is produced, some of the main-body lands are hidden by the motor. Therefore, the phenomenon can be also recognized through the main-body lands.

In addition, when this solder passes through a reflow furnace after being screen-printed on the main-body lands 62, the main-body lands and the back-surface terminals are soldered and connected to each other while the main-body lands 62 and the metal surfaces 49 (FIG. 3), and the main-body lands 62 and the protrusion portions 59 (FIG. 2B) form fillets 66 (FIG. 3). Without these fillets 66, for example, it is presumed that falling impact force generated when the electronic equipment has a fall or the like acts on the equipment or the motor 18 so as to make the motor 18 separate from the main-body printed board 9 Therefore, the fillets 66 are provided for increasing the separation strength of the motor 18 from the main-body printed board 9 while minimizing the mounting area of the motor 18. That is, each solder area is equal to the total amount of areas of the surface terminal 47 and the metal surface 49 substantially perpendicular to the surface of this surface terminal 47. Without this metal surface 49, the solder area would become extremely small, and the area of the surface terminal would have to be further increased in order to ensure an equivalent area. Accordingly, the mounting efficiency would be lowered extremely.

In addition, in this embodiment, the function of the line lands 63 as marks for identification is also given to the main-body lands 62. That is, the main-body lands 62 as well as the line lands 63 are formed to be exposed or bared at positions outside the outline of the motor so that when there is a mounting displacement as mentioned above, the line lands 63 or main-body lands 62 can be hidden by the motor 18.

Next, description will be made about the assembling and operation of respective portions with reference to FIGS. 1 to 4.

First, as shown in FIG. 4, a plurality of hook claws 64 are hung on the notches 61 of the main-body printed board 9 while one side (back surface) of the main-body printed board 9 is covered with the shield case 19. In such a manner, the shield case 19 is fixedly attached to the main-body printed board 9 (see FIG. 1).

Next, as shown in FIG. 1, these main-body printed board 9 and shield case 19 together with the receiver 5, the liquid-crystal display 6 and the key sheet 7 are received in the case constituted by the upper case 1 and the lower case 2. The transparent window 15 is provided for the aperture 14, and, at last, the battery 10 is furnished. The equipment is thus completed.

On the main-body printed board 9, the motor 18 and a motor driving circuit are mounted together with electronic parts constituting the receiving circuit 16 and the radio circuit portion 17. The motor 18 is disposed on the main-body printed board 9 by a mounting machine after solder is screen-printed on the main-body lands 62 (FIGS. 3 and 4).

Next, by being passed through a reflow furnace, the solder is fused and solidified so that the motor 18 and other electronic parts are electrically connected with the main-body printed board 9. As for the motor 18, the back-surface terminals 27 at the bottom of the motor is reflow-soldered with the main-body lands 62 of the main-body printed board 9, from which the electric power is to be supplied to the coil 46.

As shown in FIG. 3, the motor driving circuit excites the stator through the signal terminals 28 to 31 and the surface terminals 47. As a result, the magnet 56 is driven so that the rotor 43 is rotated. Since the rotor 43 has amass eccentricity, centrifugal force is generated in the equipment together with the rotation of the rotor 43, and this centrifugal force is transmitted to the equipment so as to generate vibration of the equipment. For example, the vibration of the equipment vibrated in a pocket of clothes of a user is transmitted to the body of the user so that the user can perceive incoming through the vibration.

Next, description will be made about consideration which should be given to the operation of "suction of the automatic sucking machine".

The motor 18 in this embodiment is substantially throughout surrounded by the wall surfaces 26, as shown in FIGS. 2A to 2C. The flat portion 24 to which a suction chuck can be opposed is provided substantially at the center of the top portion 21. Specifically, the flat portion 24 is formed into a circular surface having a diameter of about 6 mm. Through the flat portion 24, the top portion can be chucked pneumatically by the air sucking machine. Therefore, when parts received in a package such as a pallet, a reel or the like are supplied, the flat portion 24 of the motor 18 received in the package is sucked by the air sucking machine, and the motor 18 is transferred onto the main-body printed board 9 and then released from suction. Sucking, transferring and mounting of the motor 18 is thus accomplished.

The sucking machine may be a transfer machine provided with movable chuck claws. In this transfer machine, two opposite sides of a portion to be sucked are gripped from the outside of the external form of the portion by a movable chuck after being chucked pneumatically so that centering is achieved. Preferably, the opposite sides are formed in parallel and symmetrically with respect to the center of the portion. In this embodiment, in order to correspond to an air sucking machine also having movable chuck claws, the motor cover 44 and the motor printed board 41 are formed to be substantially octagonal so that centering can be achieved by chucking the external form of the motor printed board.

Next, description will be made about measures "during passage through a reflow furnace" at a high temperature.

The cover 44 (FIG. 3) can protect the inside of the motor 18 from hot air or infrared rays in a reflow furnace, so that the motor structure inside the motor 18 can be prevented from being broken by heating. Flux is mixed into creamy solder to be used in order to improve wettability of the solder. As this flux is heated, the flux scatters as a solder ball in which the flux is coupled with a very small amount of solder. In the case where the scattered ball adheres to the coil 46 (FIG. 3) or the magnet 56 (FIG. 3), such a solder ball rubs against the coil 46 or the magnet 56 when the motor 18 starts its operation. This causes disturbance against the operation of rotation or occurrence of irregular noise so as to give a user the impression that the equipment has got out of order. However, if the cover 44 is provided, it is possible to reduce courses of invasion of solder balls into the cover 44. Accordingly, it is possible to avoid unexpected troubles as mentioned above.

In addition, the forward end of the wall surface 26 (FIG. 2B) of the cover 44 does not abut against the motor printed board 41 (FIG. 3) at portions in the vicinity of the signal terminals 28 to 31 (FIG. 2C). That is, the air holes 58 are provided so that the inside of the motor 18 communicates with the outside through very small gaps. Electronic parts constituting the receiving circuit portion 16 and the radio circuit portion 17 together with the main-body printed board 9, the motor and so on pass through an atmosphere at 150° C. to 250° C. for a predetermined time when they pass through a reflow furnace so as to be mounted on this main-body printed board 9. At this time, if the inside of the cover 44 has a closed structure, the internal air expands thermally so that force to separate the cover from the motor printed board 41 is generated on the inner surface of the cover 44. However, if the very small air holes 58 which make the outside and inside of the cover 44 communicate with each other are provided as described above, it is possible to prevent the internal air from expanding, so that it is possible to avoid unexpected troubles. In such a manner, a structure suitable for a reflow mounting system is realized. Therefore, there is no fear that any harmful influence is brought by solder balls scattered in a reflow furnace or by passage of the motor 18 and so on in an atmosphere at a high temperature.

Next, description will be made about "inspection after reflow process".

At least, if the flat portion 24 or the top portion 21 of the cover 44 is formed substantially in parallel with the motor printed board 41, the distance between the upper surface of the main-body printed board 9 and the flat portion 24 or the top portion 21 is kept constant after the motor 19 has been mounted normally. However, when mounting is performed abnormally, for example, in a condition that dust, dirt or a solder ball is put between the main-body printed board 9 and the motor printed board 41, the flat portion 24 or the top portion 21 inclines with respect to the main-body printed board 9. In the mounting process, for example, the distance between the main-body printed board 9 and the flat portion 24 is confirmed by an image recognition unit or the like, so that this inclination is detected. In such a manner, it is judged whether mounting is performed abnormally or not. However, unless the distance between the flat portion 24 of the motor 18 and the motor printed board 41 is formed with precision, there is a case where mounting is regarded as abnormal though the mounting is performed normally.

In this embodiment, the distance between the flat portion 24 and the forward end of the wall surface 26 of the cover 44 which abuts against the motor printed board 41 is formed with precision by a mold, and the metal surfaces 49 and the protrusion portions 59 are connected by solder after the forward end of the wall surface 26 has been brought into abutment against the motor printed board 41. Therefore, the distance between the main-body printed board 9 and the flat portion 24 is kept precise after the motor 18 has been mounted. Accordingly, it is possible to avoid such an aforementioned fact that mounting is regarded as abnormal though the mounting is performed normally. Therefore, the height and inclination of parts which have been mounted can be recognized accurately, so that it is possible to judge whether the parts are inclined/floated or not.

Next, description will be made about "quality".

The motor for generating vibration shown in this embodiment is a brushless motor having no brush. Since the motor has the stator 40 in which the coil 46 is wound on the stator core 45, however, the inductance is large so that the amount of noise generated in the motor is larger than that in a coreless-type motor.

Even in the case of a so-called brush-type motor having a brush commutator mechanism, if two brushes abut against one commutator, a spark is caused by a short-circuit so as to generate noise.

Therefore, if an electromagnetic shielding property is given to the cover 44 in such a manner that the cover 44 is formed of iron, copper, nickel silver or resin and the surface thereof is plated, generated noise can be prevented from giving bad influence to parts close to the motor. Accordingly, it is unnecessary to electromagnetically shield the motor from other electronic parts by means of a shield case for preventing electromagnetic waves from passing, so that it is not necessary to provide ribs or the like for installing the shield case in a gap between the other electronic parts and the motor 18. It is therefore possible to save spaces and clearances for these members and parts to improve the mounting efficiency. Accordingly, it is possible to save the space.

Such an electronic equipment is often used outdoors, and it may be dropped on the ground when it is taken from a pocket. For example, when the equipment is dropped on a sandbox in a park or the like, there is a fear that iron sand or dust contained in sand makes an invasion into the equipment through a gap of the equipment.

Since a brushless outer-rotor motor fulfilled its function without any cover in itself, it was used without any cover in the background art. However, when the cover 44 for covering the rotor 43 is provided as in this embodiment, it is possible to prevent such a fact that iron sand is absorbed by the magnet 56 or dust invades a gap so as to cause an operation failure. Accordingly, it is possible to improve the reliability of the motor 18 and the equipment.

In addition, the protrusion portion 59 formed at the forward end of the wall surface 26 is fixed by soldering to the corresponding metal surface 49 of the motor printed board 41 in advance. Further, the protrusion portion 59 is connected to the grounding pattern of the main-body printed board 9, and electrically connected to the main-body land 62 by solder so that the cover 44 is grounded. In such a manner, it is designed to solve such a problem that the cover 44 is electrified so that the potential thereof changes and a leakage current flows into a land close to the cover 44 and further transmitted to signal lines or a VCO on the main-body printed board 9. Accordingly, the accuracy of frequency modulation is reduced so that stable transmission/reception is made impossible.

The marking 25 may be made convex or concave relative to the environment thereof. The marking 25 may be formed by a mold for manufacturing a part (a cover in this embodiment) for forming the top portion 21 or the side portion 22, simultaneously with the part. This has an advantage that the marking 25 can be used for any of visual recognition, magnetic reaction, or a height sensor. Further, a method of using a matter, for example, magnetic ink, having a difference in magnetic reaction from the environment may be employed.

In addition, ferromagnetic material (steel) is suitable for the material of the cover. The cover can cope with a magnetic chuck so as to make it possible to use the chuck means substituted for a pneumatic chuck or a grip chuck. In addition, the ferromagnetic material is convenient to form a marking using magnetic reaction.

The shape of the motor printed board 41 is not always limited to be substantially octagonal. For example, if it is substantially quadrilateral, similar operation and effect can be provided. When the shape of the motor printed board 41 is made polygonal, that is, when it is made larger than but extremely close to a circle formed by the outermost shape of the rotating rotor 43, the area of the motor printed board 41 occupying the main-body printed board 9 can be reduced, so that the space for mounting can be saved and the size of the main-body printed board can be reduced. When the shape of the motor printed board 41 is made substantially rectangular, it will go well if the back-surface terminals 27 and the metal surfaces 49 are provided in the outside of the rotor 43. Then, if the outline of the motor printed board 41 is circular and the marking 25 for indicating the position is absent, effects similar to those in this embodiment cannot be obtained. That is, if the marking 25 is not provided and the motor printed board 41 is circular, in the case where the motor printed board 41 is mounted so as to rotate in the area surrounded by the line lands 63 formed in the outside of the motor printed board 41, the mounting position of the motor printed board 41 cannot be recognized. In other words, it is necessary to form the motor printed board 41 into a shape other than a circle, or it is necessary to provide the marking 25.

In this embodiment, the mounting position is confirmed by detecting the position of the marking from above by means of an image recognition unit, and the presence/absence of the fillets 66 formed in the outside of the outline of the motor and the outline of the motor printed board 41 is confirmed from above by irradiation and exposure with laser and by means of the image recognition unit. In the case where the fillets 66 are present, it is concluded that the back-surface terminals 27 and the main-body lands 62 are electrically connected normally.

In addition, the line lands 63 are provided in the outside of the outline of the motor printed board 41 so that the line lands 63 can be judged easily even by visually.

The line lands 63 may have another aspect. Although each of the line lands 63 is formed into an "L" shape surrounding a ridge portion formed by two sides of the motor printed board 41 in this embodiment, it may surround the whole circumference of the motor printed board 41, or it may be printed or of resist (insulating film). It will go well if the object of the line lands 63 is achieved, that is, if the line lands 63 are marks for making it clear that the position where the motor printed board 41 has been mounted on the main-body printed board is a predetermined position after the mounting.

The reason why the line lands 63 are provided separately from the main-body lands 62 is as follows. Solder is put on the surfaces of the main-body lands 62 and the surfaces of the main-body lands 62 become curved. Accordingly, the main-body lands 62 become impossible to be recognized by the image recognition unit. Therefore, further lands on which no solder is put (line lands 63) are provided in this embodiment.

Incidentally, without providing any line land, the above-mentioned object can be achieved also by the main-body lands which are exposed or bared in the outside of the outline of the motor.

Although a so-called brushless motor having no brush is used as the motor 18 in this embodiment, the present invention is not always limited to this form, but may be realized, for example, with a brush-type motor having brushes.

Specifically, such a motor is obtained by improving the form of a background-art motor such as a flat coreless vibration motor disclosed in JP-A-6-205565. That is, this flat coreless vibration motor is constituted by: a rotor having at least three armature coils disposed in the balance so as not to be overlapped with one another, and having a plane formed substantially into a fan-shape as a whole; a shaft disposed at the center of this rotating rotor; a plate commutator disposed on the rotor so as to be coaxial with this shaft; a magnet facing the rotor; a brush disposed inside this magnet and abutting against the plate commutator; and a casing for storing these parts. First, there are following four problems in making the motor possible to be subjected to reflow:

First, the brush and the main-body printed board cannot be electrically connected by reflow-soldering;

Secondly, the bottom of the casing is not flat;

Thirdly, air leakage occurs because of the presence of the shaft at the center when the motor is sucked, so that the motor cannot be sucked as one of parts; and Fourthly, there is no means for identifying the direction of the motor after the motor has been mounted on the main-body printed board.

In such a flat coreless vibration motor is improved so that one side (on the bottom side) of the casing to which the magnet is fixed is configured as a motor printed board, and the magnet is installed on this motor printed board while the above-mentioned rotor is provided so as to face this magnet, as in this embodiment, and further, if a cover for covering the rotating rotor is attached to the motor printed board as in this embodiment in order to make it possible that the motor can be sucked by a sucking machine, there is no fear that the motor printed board rotates when the motor is sucked. In such a manner, by providing a motor printed board and a motor cover, such a motor can be reflowed, sucked and transferred, so that the motor can be improved so as to be automatically mounted on the main-body printed board.

As has been described above, according to this embodiment, the rotating body (rotor) 43 is provided on a base (a motor printed board) 41 having a shape other than a circle, and the cover 44 for covering the rotating body is further provided, so that the lower portion of the cover does not rotate even if the cover is sucked. Accordingly, there is no change between the states before and after the suction. When the base is disposed on the main-body printed board 9 after being transferred, if there are marks outside the base, it can be easily judged whether the base has been rotated or displaced.

In addition, if the position of the marking 25 which can be confirmed from above is confirmed, it can be easily detected whether the base is rotated or displaced from its predetermined position. For example, in the case where the motor printed board 41 is octagonal, if the motor printed board 41 is mounted so as to be rotated clockwise or counterclockwise by 45° inside the line lands 63, the marking 25 is rotated by 45° in the same direction as that of the motor printed board 41 though the motor printed board 41 is located inside the line lands 63. Therefore, the mounting can be accurately judged to be abnormal.

It is not always necessary to provide the marking 25 indicating directivity on the cover. For example, if the motor printed board 41 has an octagonal shape in which one of the eight sides differs from the others, or in which a protrusion portion or a notch is formed in one side, the direction of the motor printed board 41 can be recognized from above or below by an image recognition unit. Thus, the marking 25 may be replaced by such a structure that a portion indicating the directivity is provided on the outline of the motor printed board 41.

Although the shield case 19 for covering respective circuits on the main-body printed board 9 was provided, an electromagnetic shielding property may be given to the lower case 2, for example, by providing vapor deposition or plating to the inner surface of the lower case 2.

That is, according to the present invention, all the following steps can be executed without any problem.

(1) To suck, transfer and mount a vibration motor;

(2) To pass the vibration motor through a reflow furnace; and (3) To confirm the height and mounting position of the vibration motor after mounting it.

Although the present invention has been described about the process of a vibration motor by way of example, the present invention may be widely applied to various general forms of motors other than the vibration motor, automatically wiring process of other parts, and so on.

As has been described above, according to the present invention, in a motor or a vibration motor in which a stator and a rotor are provided on the surface side of a motor board which is a base, and either one of the stator and the rotor is made rotatable, the motor is covered with a cover having a flat portion, and line lands and main-body lands as marks for identifying the mounting position are provided outside the outline of the motor board after terminals formed on the back surface of the motor board are connected to a main-body printed board by soldering. Accordingly, there is an effect that the motor or vibration motor becomes easy to be sucked by an automatic sucking machine in a step, and it can be easily judged whether the mounting has been performed in an accurate position, whether the terminals and the main body have been connected to each other surely, whether the terminals are in abutment or short-circuit against other parts, and so on.

In addition, in a vibration motor or a motor in which a stator and a rotor are provided on the surface side of a motor board and either one of the stator and the rotor is made rotatable, and which is covered with an electromagnetically shielding cover, a shield member is provided to cover parts on a main-body printed board onto which the vibration motor is mounted, and to store the vibration motor inside the shield member. Without a special shield member provided between the vibration motor and the other mounted parts, a malfunction of any electronic part close to the vibration motor can be prevented from being caused by noise generated from the vibration motor. Therefore, there is an effect that a large mounting area can be ensured on the main-body printed board, the mounting efficiency is improved, and the size and the weight of the equipment can be reduced.

In addition, a flat portion and air holes are formed in the motor cover, and the cover is configured so that positioning in the height direction can be performed accurately by making the forward end of the wall surface of the cover abut against a motor printed board. Accordingly, there is an effect that suction, transfer and mounting can be performed accurately in a reflow step. Further, it is possible to prevent the cover from being removed in the reflow step, and it is possible to recognize the height of parts with precision after soldering. Accordingly, the conditions that the reflow step is carried out are satisfied, so that the work of manual soldering or the like can be omitted. Therefore, there is an effect that the equipment can be configured suitably for mass production.

In addition, when the motor cover is grounded, the motor cover can be prevented from electrification. Accordingly, there is an effect that it is possible to provide an electronic equipment in which the accuracy of frequency modulation can be kept, and stable transmission/reception can be attained.

What is claimed is:

1. An apparatus comprising:
    a vibration motor having:
        a base having a front surface;
        a rotary member provided on the front surface of the base; and
        a cover having an electromagnetically shielding property and a top and sides covering the rotary member, wherein the top has a flat surface;
    a board on which the vibration motor is mounted; and
    a shield member covering at least a part of the board, wherein the vibration motor is disposed inside the shield member.

2. An apparatus according to claim 1, wherein the cover has a hole for connecting spaces of inside and outside of the cover to each other.

3. An apparatus according to claim 1, wherein the cover perfectly contacts to the front surface of the base to perform positioning of the cover in a height direction.

4. An apparatus according to claim 1, further comprising a fillet formed on an outside of the base and used for positioning the vibration motor.

5. An apparatus according to claim 1, wherein the cover is electrically connected to the board.

6. Portable electronic equipment comprising an apparatus according to claim 1.

7. An apparatus according to claim 1, wherein the cover is made of resin;
    the cover is coated with non-electrolytic copper; and
    the cover coated with non-electrolytic copper is coated with non-electrolytic nickel.

8. An apparatus according to claim 7, wherein the resin is selected from the group consisting of acrylonitrile, butadiene and styrene.

9. An apparatus comprising:
    a vibration motor having:
        a base having a front surface;
        a rotary member provided on the front surface on the base;
        an eccentric member provided on the rotary member; and
        a cover having an electromagnetically shielding property and covering the rotary member and the eccentric member;
    a board on which the vibration motor base is mounted, and
    a shield member covering at least a part of the board, wherein the vibration motor is disposed inside the shield member.

10. An apparatus according to claim 9, wherein the cover has a hole for connecting spaces of inside and outside of the cover to each other.

11. An apparatus according to claim 9, wherein the cover contacts to the front surface of the base to perform positioning of the cover in a height direction.

12. An apparatus according to claim 9, further comprising a fillet formed on an outside of the base and used for positioning the vibration motor.

13. An apparatus according to claim 9, wherein the cover is electrically connected to the board.

14. Portable electronic equipment comprising an apparatus according to claim 9.

15. An apparatus comprising:
    a vibration motor having:
        a base having a front surface;
        a rotary member provided on the front surface of the base; and
        a cover having an electromagnetically shielding property and covering the rotary member;
    a board on which the vibration motor base is mounted;
    a shield member covering at least a part of the board, wherein the vibration motor is disposed inside the shield member; and
    a housing enclosing the board and shield member.

16. An apparatus according to claim 15, wherein the cover has a hole for connecting spaces of inside and outside of the cover to each other.

17. An apparatus according to claim 15, wherein the cover contacts to the front surface of the base to perform positioning of the cover in a height direction.

18. An apparatus according to claim 15, further comprising a fillet formed on an outside of the base and used for positioning the vibration motor.

19. An apparatus according to claim 15, wherein the cover is electrically connected to the board.

20. Portable electronic equipment comprising an apparatus according to claim 15.

* * * * *